US010772189B2

(12) United States Patent
Sumida et al.

(10) Patent No.: US 10,772,189 B2
(45) Date of Patent: Sep. 8, 2020

(54) ELECTRICITY STORAGE UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Tatsuya Sumida, Mie (JP); Kyohei Morita, Mie (JP); Kazuhide Kitagawa, Mie (JP); Hisao Hattori, Mie (JP)

(73) Assignees: Sumitomo Wiring Systems, Ltd., Yokkaichi, Mie (JP); AutoNetworks Technologies, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 146 days.

(21) Appl. No.: 15/520,759

(22) PCT Filed: Oct. 9, 2015

(86) PCT No.: PCT/JP2015/078751
§ 371 (c)(1),
(2) Date: Apr. 20, 2017

(87) PCT Pub. No.: WO2016/067897
PCT Pub. Date: May 6, 2016

(65) Prior Publication Data
US 2017/0311433 A1    Oct. 26, 2017

(30) Foreign Application Priority Data

Oct. 30, 2014    (JP) ................. 2014-221340

(51) Int. Cl.
*H05K 1/02* (2006.01)
*H05K 1/18* (2006.01)
(Continued)

(52) U.S. Cl.
CPC ........... *H05K 1/0203* (2013.01); *H02G 3/086* (2013.01); *H05K 1/18* (2013.01); *H05K 1/142* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS

2006/0061937 A1\* 3/2006 Takemoto ............. B60R 16/023
361/328
2007/0114083 A1 5/2007 Asao et al.
(Continued)

FOREIGN PATENT DOCUMENTS

JP     2004-114775 A      4/2004
JP     2004-291891 A      10/2004
(Continued)

OTHER PUBLICATIONS

Search Report for International Application No. PCT/JP2015/078751, dated Dec. 22, 2015, 2 pp.

*Primary Examiner* — Adam B Dravininkas
(74) *Attorney, Agent, or Firm* — Honigman LLP

(57) ABSTRACT

An electricity storage unit includes: an electricity storage device; a circuit portion on which an electronic component is mounted; a heat dissipation member that dissipates heat from the circuit portion; and a holding member that holds the electricity storage device in a state where the electricity storage device, the circuit portion, and the heat dissipation member are stacked, wherein the holding member is provided with a supporting portion that supports the electricity storage device and abuts against the heat dissipation member.

15 Claims, 17 Drawing Sheets

(51) Int. Cl.
*H02G 3/08* (2006.01)
*H05K 3/00* (2006.01)
*H05K 1/14* (2006.01)

(52) U.S. Cl.
CPC ... *H05K 3/0061* (2013.01); *H05K 2201/1003* (2013.01); *H05K 2201/10015* (2013.01); *H05K 2201/10166* (2013.01)

(58) Field of Classification Search
CPC ..... H05K 7/20009–202; H05K 1/0203; H05K 1/18; H05K 1/142; H05K 3/0061; H05K 2201/10015; H05K 2201/1003; H05K 2201/10166; H05K 3/32; H05K 1/0218; H05K 1/0262; H05K 1/0263; H05K 1/0298; H05K 1/0209; H01L 23/367–3677; H01L 23/473; H01L 23/46–467; H02G 3/086
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2008/0119068 A1* | 5/2008 | Shimizu | ............... | H05K 5/0208 439/76.2 |
| 2008/0272278 A1* | 11/2008 | Shewa | ............... | F21S 8/022 250/206 |
| 2010/0112429 A1* | 5/2010 | Murata | ............... | H01M 10/625 429/120 |
| 2010/0151299 A1* | 6/2010 | Ha | ............... | H01M 10/482 429/61 |
| 2011/0244282 A1* | 10/2011 | Seto | ............... | H01M 10/6553 429/82 |
| 2012/0170217 A1* | 7/2012 | Nishikimi | ............... | H05K 7/20927 361/689 |
| 2012/0301763 A1* | 11/2012 | Tonomura | ............... | H01M 2/06 429/99 |
| 2013/0202936 A1* | 8/2013 | Kosaki | ............... | H01G 9/155 429/99 |
| 2013/0337299 A1* | 12/2013 | Sugawara | ............... | H01M 2/206 429/61 |
| 2014/0295242 A1* | 10/2014 | Kimura | ............... | H01M 2/1072 429/120 |
| 2014/0370353 A1* | 12/2014 | Oshiba | ............... | H01M 2/1077 429/120 |
| 2014/0370366 A1* | 12/2014 | Higuchi | ............... | H01M 2/30 429/158 |
| 2014/0377623 A1* | 12/2014 | Pyzza | ............... | H01G 11/10 429/120 |
| 2015/0125720 A1* | 5/2015 | Fujii | ............... | H01M 2/1077 429/56 |
| 2015/0228947 A1* | 8/2015 | Nagamine | ............... | H01M 2/1276 429/87 |
| 2015/0243450 A1* | 8/2015 | Shimoda | ............... | H01M 2/1077 429/179 |
| 2015/0305188 A1* | 10/2015 | Maeda | ............... | H05K 7/1432 361/728 |
| 2016/0013526 A1* | 1/2016 | Uchiyama | ............... | H01M 10/613 429/71 |
| 2016/0111702 A1* | 4/2016 | Ohsumi | ............... | H01M 2/1083 429/179 |
| 2016/0218333 A1* | 7/2016 | Takasaki | ............... | H01M 2/12 |
| 2016/0219758 A1* | 7/2016 | Kawaguchi | ............... | H05K 7/20927 |
| 2016/0240902 A1* | 8/2016 | Yamamoto | ............... | H01M 2/1077 |
| 2016/0268560 A1* | 9/2016 | Hascoet | ............... | H01M 2/1077 |
| 2017/0018747 A1* | 1/2017 | Yamada | ............... | H01M 2/0262 |
| 2017/0141366 A1* | 5/2017 | Inakawa | ............... | B60K 1/04 |
| 2017/0271634 A1* | 9/2017 | Hasegawa | ............... | H01M 2/10 |
| 2017/0278645 A1* | 9/2017 | Wakinaka | ............... | H01G 11/82 |
| 2018/0013106 A1* | 1/2018 | Kano | ............... | H01M 2/1094 |

FOREIGN PATENT DOCUMENTS

| | | |
|---|---|---|
| JP | 2005-094943 A | 4/2005 |
| JP | 2013-045691 A | 3/2013 |
| JP | 2014-013724 A | 1/2014 |
| JP | 2014-082844 A | 5/2014 |

* cited by examiner

ELECTRICITY STORAGE UNIT

CROSS-REFERENCE TO RELATED APPLICATIONS

This application is the U.S. national stage of PCT/JP2015/078751 filed Oct. 9, 2015, which claims priority of Japanese Patent Application No. JP 2014-221340 filed Oct. 30, 2014.

TECHNICAL FIELD

The present description discloses technology that is provided with a circuit portion and electricity storage devices.

BACKGROUND

There are conventionally known electrical connection boxes that include a casing that houses a circuit portion on which electronic components are mounted. JP 2014-82844A discloses an electrical connection box that includes: a circuit portion on which electronic components are mounted; an electrically-conductive heat dissipation member that dissipates heat from the circuit portion; and an electrically-conductive casing in which the circuit portion is housed so as to be located between the casing and the heat dissipation member.

In the case where an electrical connection box and electricity storage devices are mounted on a vehicle or the like, if they are separately mounted, the space for mounting them increases, and electrical wires and connectors for connecting them are needed. Therefore, there is a problem in that the number of components increases, the weight increases, and electrical power transmission loss occurs due to the resistance of the electrical wires.

On the other hand, it is preferable that the circuit portion and the electricity storage devices of the electrical connection box are mounted together because the space for mounting them can be reduced, an increase in the weight due to the presence of electrical wires, connectors, and so on can be suppressed, and electrical power transmission loss due to the resistance of the electrical wires is prevented from occurring.

JP 2005-94943A discloses a capacitor unit that includes: a capacitor block; a control circuit portion that is constituted by a charging/discharging circuit for charging or discharging the capacitor block; and a casing in which the capacitor block and the control circuit portion are housed. The casing is constituted by a lower casing and an upper cover. The capacitor block is housed in the lower casing and is fixed using screws.

However, if the circuit portion and the electricity storage devices are mounted together, there is a concern that a problem will occur due to the weight of the electricity storage devices because electricity storage devices are usually heavy. According to JP 2005-94943A, the capacitor block is fixed to the casing. However, this casing has a configuration for not only covering the entire body of the capacitor block and the control circuit portion, but also fixing the capacitor block and the heat dissipation plate of the control circuit portion. Therefore, there is a problem in that the configuration of the casing is complex, and it is not easy to miniaturize the configuration of the capacitor unit.

The present invention has been completed based on the above-described situation, and aims to form an electricity storage unit that can prevent the circuit portion from being damaged, without increasing the size of the electricity storage unit despite the circuit portion and the electricity storage devices being mounted together.

SUMMARY OF THE INVENTION

An electricity storage unit according to the present invention includes: an electricity storage device; a circuit portion on which an electronic component is mounted; a heat dissipation member that dissipates heat from the circuit portion; and a holding member that holds the electricity storage device in a state where the electricity storage device, the circuit portion, and the heat dissipation member are stacked, wherein the holding member is provided with a supporting portion that supports the electricity storage device and abuts against the heat dissipation member.

If the circuit portion and the electricity storage device are mounted together, there is a concern that a problem will occur due to a force that corresponds to the weight of the electricity storage device being generated between the electricity storage device and the heat dissipation member. However, with this configuration, the supporting portion of the holding member that holds the electricity storage device supports the electricity storage device, and thus it is possible to prevent a problem from occurring due to the weight of the electricity storage device. Therefore, it is possible to form an electricity storage unit that can prevent the circuit portion from being damaged, without increasing the size of the electricity storage unit despite the circuit portion and the electricity storage device being mounted together.

The following are preferable modes for carrying out the present invention.

The holding member is made of metal, and the supporting portion is a peripheral wall that extends around the circuit portion.

With this configuration, it is possible to hold the electricity storage device in a stable position due to the presence of the peripheral wall.

The holding member is provided with a housing wall that houses the electricity storage device, and the thickness of the peripheral wall is greater than the thickness of the housing wall.

With this configuration, the supporting portion that has such a thickness can support a force that corresponds to the weight of the electricity storage device. Also, heat can be stored in the peripheral wall, and can be effectively conducted to the heat dissipation member.

The holding member is provided with a partition wall portion between the electricity storage device and the circuit portion, and the partition wall portion is provided with a positioning portion that positions the electricity storage device.

With this configuration, it is possible to position the electricity storage device using the partition wall portion between the electricity storage device and the circuit portion.

The supporting portion is provided with a stopper that is fixed to the heat dissipation member from the opposite side to the supporting portion using a screw.

With this configuration, it is possible to fix the holding member and the heat dissipation member to each other using a screw, utilizing the configuration of the supporting portion. Also, compared to the case where the stopper is fixed to the heat dissipation member from the supporting portion side using a screw, the electricity storage devices are fixed to a certain degree under the weight of the electricity storage device. Therefore, workability is improved, and miniaturization can be realized.

An attachment portion that is to be attached to an external member is provided, wherein the attachment portion is fixed to the supporting portion using a screw.

With this configuration, it is possible to fix the attachment portion utilizing the configuration of the supporting portion. Also, it is possible to stably fix the electricity storage unit to a vehicle even if the weight of the electricity storage device is heavy.

According to the present invention, it is possible to form an electricity storage unit that can prevent the circuit portion from being damaged, without increasing the size of the electricity storage unit despite the circuit portion and the electricity storage device being mounted together.

DETAILED DESCRIPTION OF THE PREFERRED EMBODIMENTS

An embodiment will be described with reference to FIGS. 1 to 17.

An electricity storage unit 10 (FIG. 1) is, for example, provided on a power supply path between a main power supply, which is constituted by, for example, a battery of a vehicle such as an electric car or a hybrid car, and a load that is constituted by, for example, an on-board electrical component such as a lamp, and a driving motor or the like. The electricity storage unit 10 can be used as, for example, an auxiliary power supply for stopping the idling of an engine or for restarting the engine, and a control apparatus for controlling charging and discharging. In the following description, a top-bottom direction and a left-right direction are defined with reference to FIG. 4 (an X direction indicates a rightward direction, and a Z direction indicates an upward direction), and regarding a front-rear direction, a downward direction and an upward direction (a Y direction) in FIG. 2 respectively indicate a forward direction and a rearward direction.

Electricity Storage Unit 10

Figure 8:
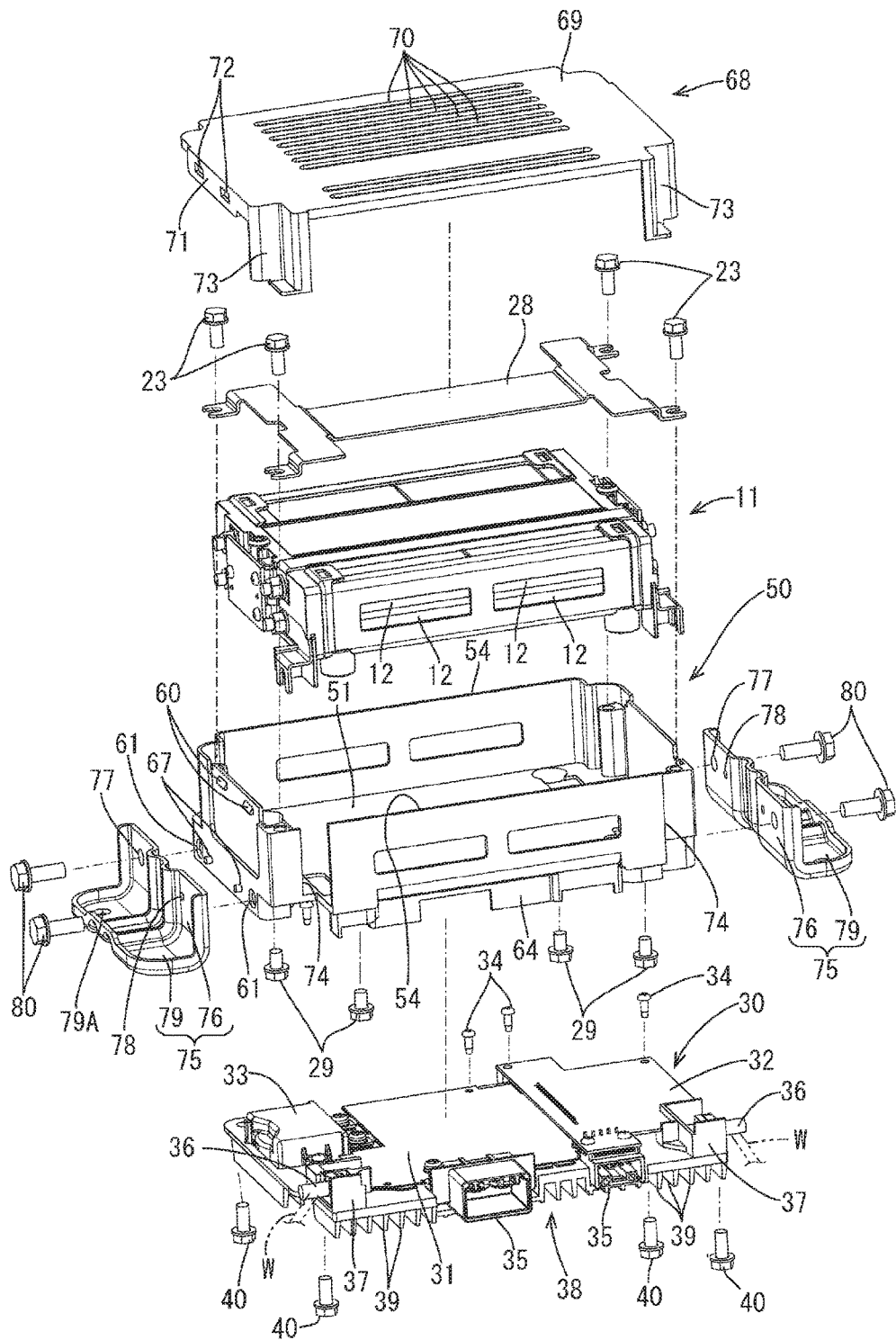
FIG. 8 is an exploded perspective view of the electricity storage unit.

As shown in FIG. 8, the electricity storage unit 10 includes: an electricity storage module 11 that includes a plurality of electricity storage devices 12 (four devices in the present embodiment); a holding member 50 that holds the electricity storage module 11; a cover 68 that covers an opening portion 54 of the holding member 50; a circuit portion 30 on which electronic components 33 are mounted; a heat dissipation member 38 that dissipates heat from the circuit portion 30; and attachment portions 75 for attaching the electricity storage unit 10 to attachment-target portions of a vehicle or the like.

Electricity Storage Module 11

Figure 9:
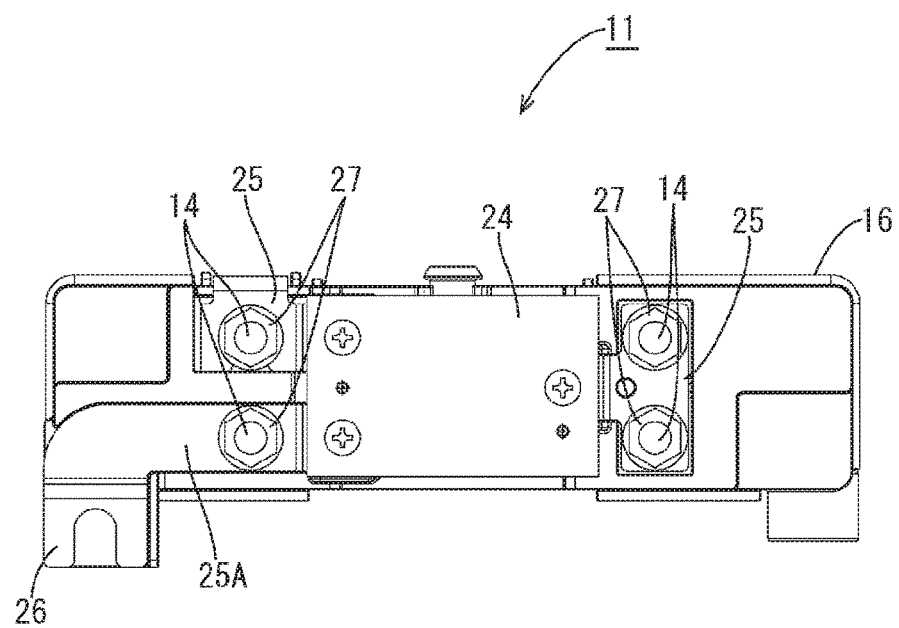
FIG. 9 is a right side view of an electricity storage module.
Figure 10:
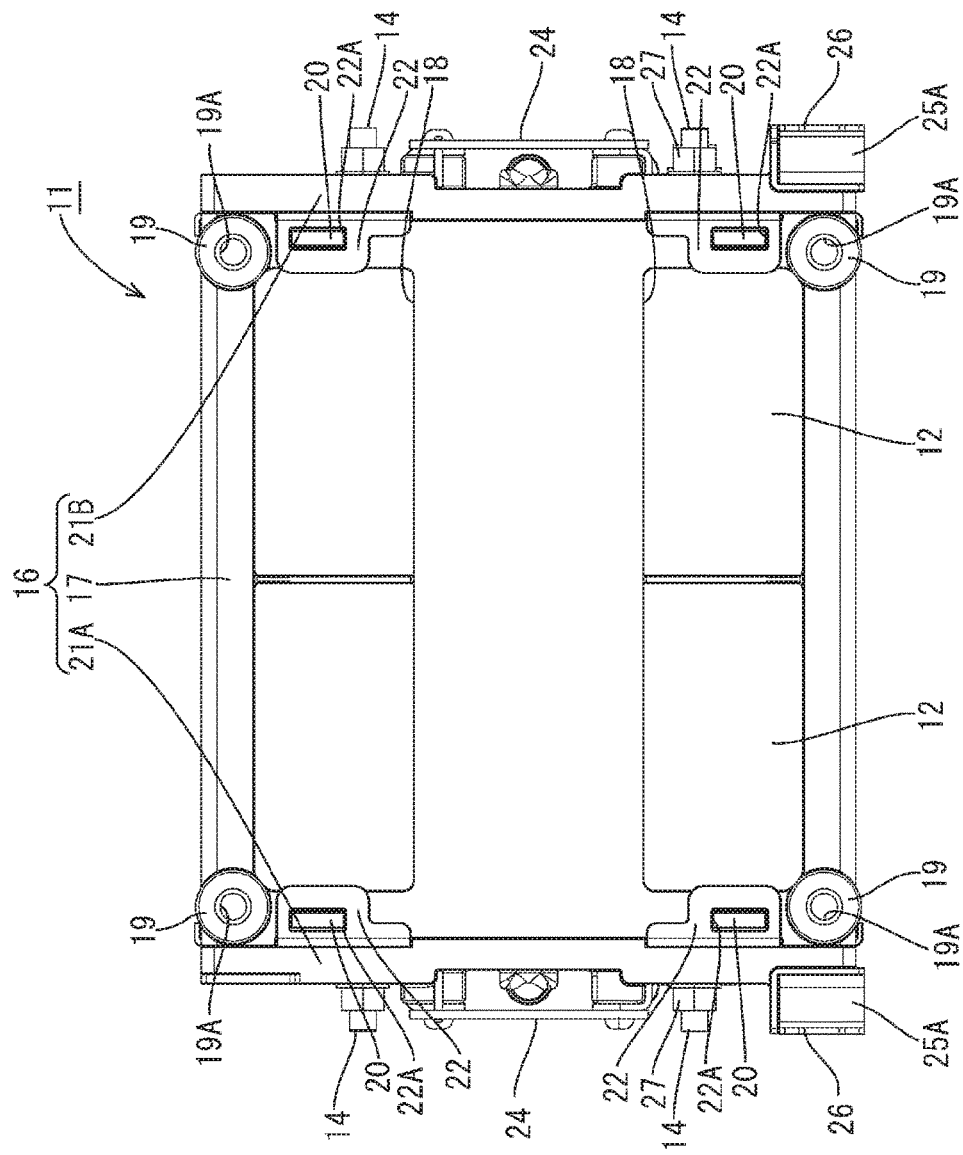
FIG. 10 is a bottom view showing the electricity storage module.

As shown in FIGS. 9 and 10, the electricity storage module 11 includes: the plurality of electricity storage devices 12 that are used as auxiliary power supplies that have a smaller capacity than a main power supply; an electricity storage device casing 16 that is made of a synthetic resin and houses the plurality of electricity storage devices 12; a pair of printed boards 24; and connection members 25 that are made of metal and connect electrode terminals 14.

The plurality of electricity storage devices 12 are arranged in two rows, namely an upper row and a lower row, and each row is composed of a pair of a left device and a right device. Each electricity storage device 12 includes a main body that has a flat cuboid shape and houses an electricity storage element, which is not shown. A pair of electrode terminals 14 protrude from an end surface of each main body at right angles. Each pair of left and right electricity storage devices 12 are arranged such that the electrode terminals 14 thereof face opposite directions. Electrode terminals 14 that have opposite polarities are connected by a connection member 25, and thus all of the plurality of electricity storage devices 12 are connected in series.

The electricity storage device casing 16 includes: a frame portion 17 in which a square tube shaped space is formed; and a pair of lid portions 21A and 21B that close left and right openings of the frame portion 17. Exposure holes 18 from which the electricity storage devices 12 are exposed are formed in and penetrate the frame portion 17. Bosses 19 that are columnar and are to be fitted into the holding member 50 to position the electricity storage module 11 protrude downward from four corners positions of a bottom surface of the frame portion 17. Screw holes 19A that allow fixing using screws 29 that are made of metal are formed in bosses 19. A taper for guiding the insertion of a screw 29 is formed at an opening of each screw hole 19A.

A locking piece 22 that is flexible is provided on a peripheral portion of each of the lid portions 21A and 21B so as to protrude toward the frame portion 17. A locking hole 22A that is rectangular is formed in and penetrates each locking piece 22. Hole edges of the locking holes 22A are locked to locking protrusions 20 that are formed on the outer surface of the frame portion 17, and thus the lid portions 21A and 21B are restricted from becoming separated from the frame portion 17.

Each of the printed boards 24 is an insulation board on which a conductive path pattern has been printed, and is electrically connected to the electrode terminals 14.

The connection members 25 are each constituted by a metal plate member that is made of a copper alloy or the like, and are fastened to the electrode terminals 14 that penetrate the lid portions 21A and 21B, using nuts 27 that serve as fastening members. Connection members 25A out of the connection members 25, the connection members 25A being connected to electrode terminals 14 that are located at end portions of the series connection, are each provided with a terminal connection portion 26 that is to be connected to a terminal portion 36 of the circuit portion 30. The terminal connection portions 26 are respectively formed at edge portions of the connection members 25A that are cranked, and respectively have edge portions that are depressed and are to be fitted onto the terminal portions 36 that are columnar.

Circuit Portion 30

The circuit portion 30 functions as, for example, a DC-DC converter or an inverter, and, as shown in FIG. 8, includes: two circuit boards 31 and 32 that are rectangular; the plurality of electronic components 33 that are mounted on the circuit boards 31 and 32; and connector portions 35 that are attached to the circuit boards 31 and 32.

The circuit board 31 is constituted by: a printed board that is an insulation board on which a conductive path pattern has been printed; and a bus bar that is formed by stamping out a metal plate member into the shape of the conductive path and is overlaid on the printed board. The circuit board 31 is fixed to a flat upper surface of the heat dissipation member 38 using an insulative adhesive. The circuit board 32 is constituted by a printed board that is an insulation board on which a conductive path pattern has been printed, and is located in an area that is different from and higher than an area in which the circuit board 31 is located. The circuit board 32 is connected to the circuit board 31 via a relay terminal. The circuit boards 31 and 32 are fixed to the heat dissipation member 38 using screws 34. The electronic components 33 include a relay such as an FET (Field Effect Transistor), a capacitor (a relay, a capacitor, etc. are omitted from FIG. 8), a coil that is fixed, using screws, to an edge portion of the circuit board 31, and so on.

Connector housings of the connector portions 35 are fixed, using screws, to edge portions of the circuit boards 31 and 32, and L-shaped connector terminals of the connector portions 35 are connected to the conductive paths of the circuit boards 31 and 32. The terminal portions 36 to which external electrical wires W are to be connected are formed at front corners of the circuit boards 31 and 32. The terminal portions 36 are held by terminal holding portions 37 that are made of a synthetic resin, and the terminal holding portions 37 are fixed to edge portions of the circuit boards 31 and 32.

Heat Dissipation Member 38

Figure 1:
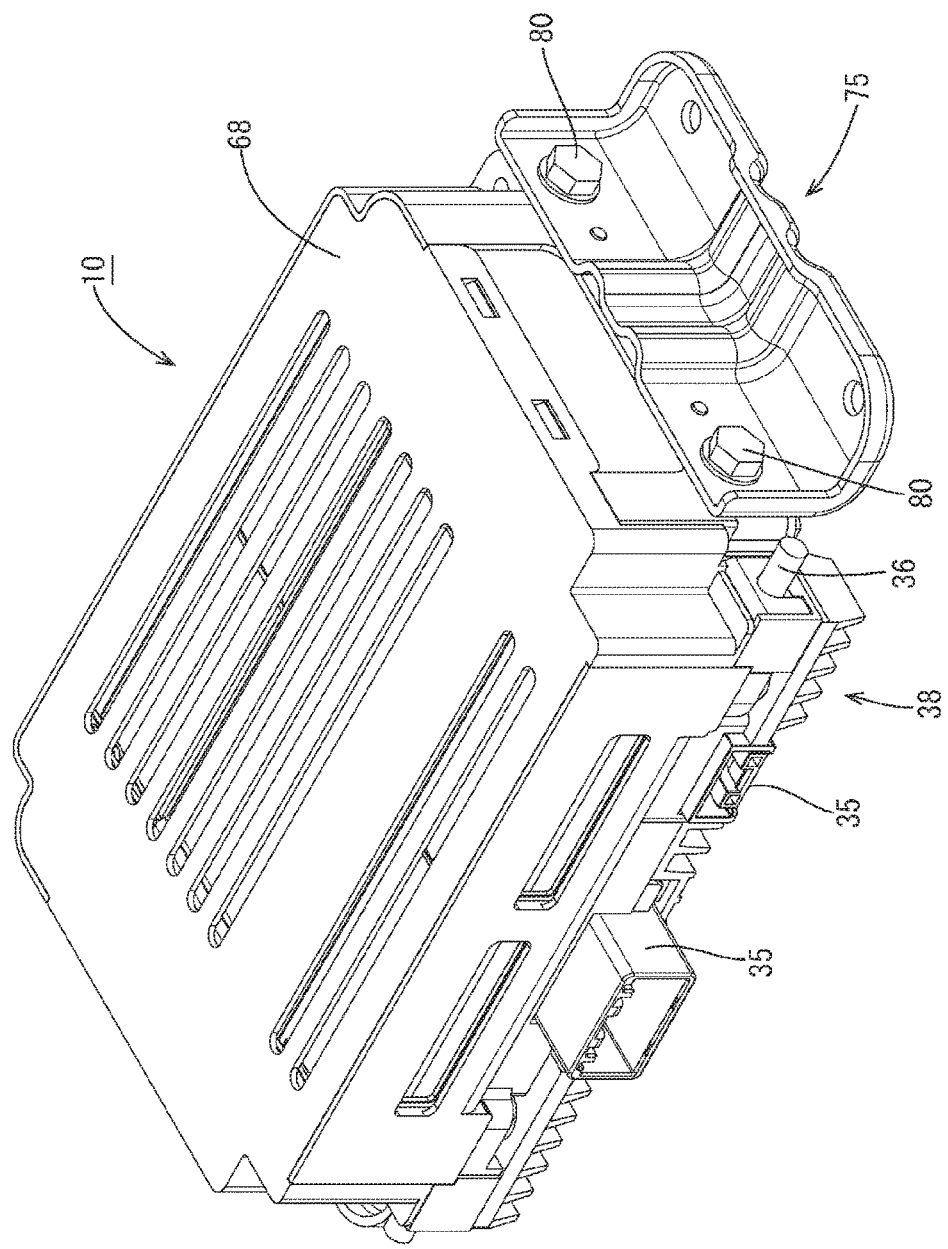
FIG. 1 is a perspective view of an electricity storage unit according to an embodiment.
Figure 2:
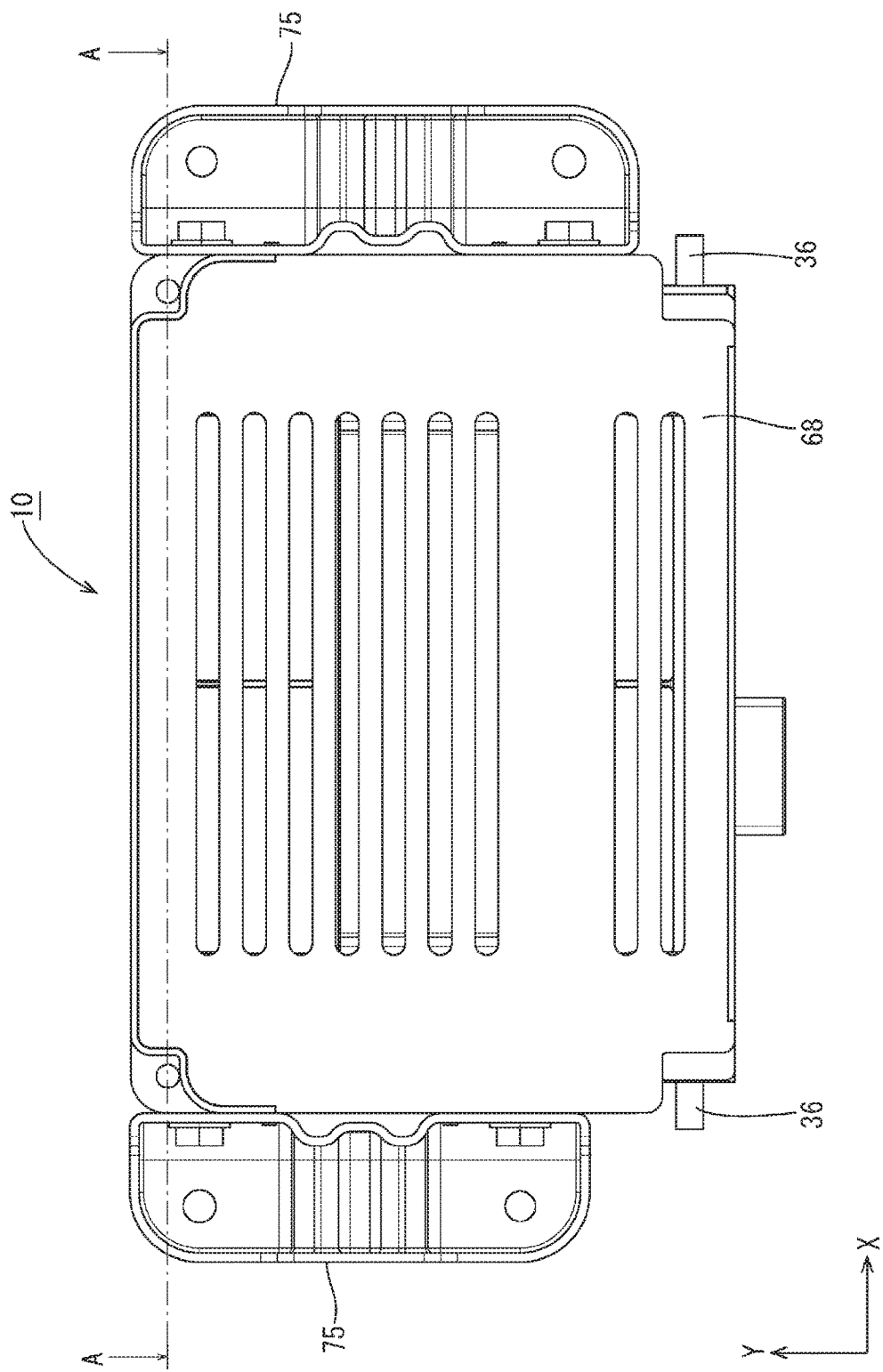
FIG. 2 is a plan view showing the electricity storage unit.
Figure 3:
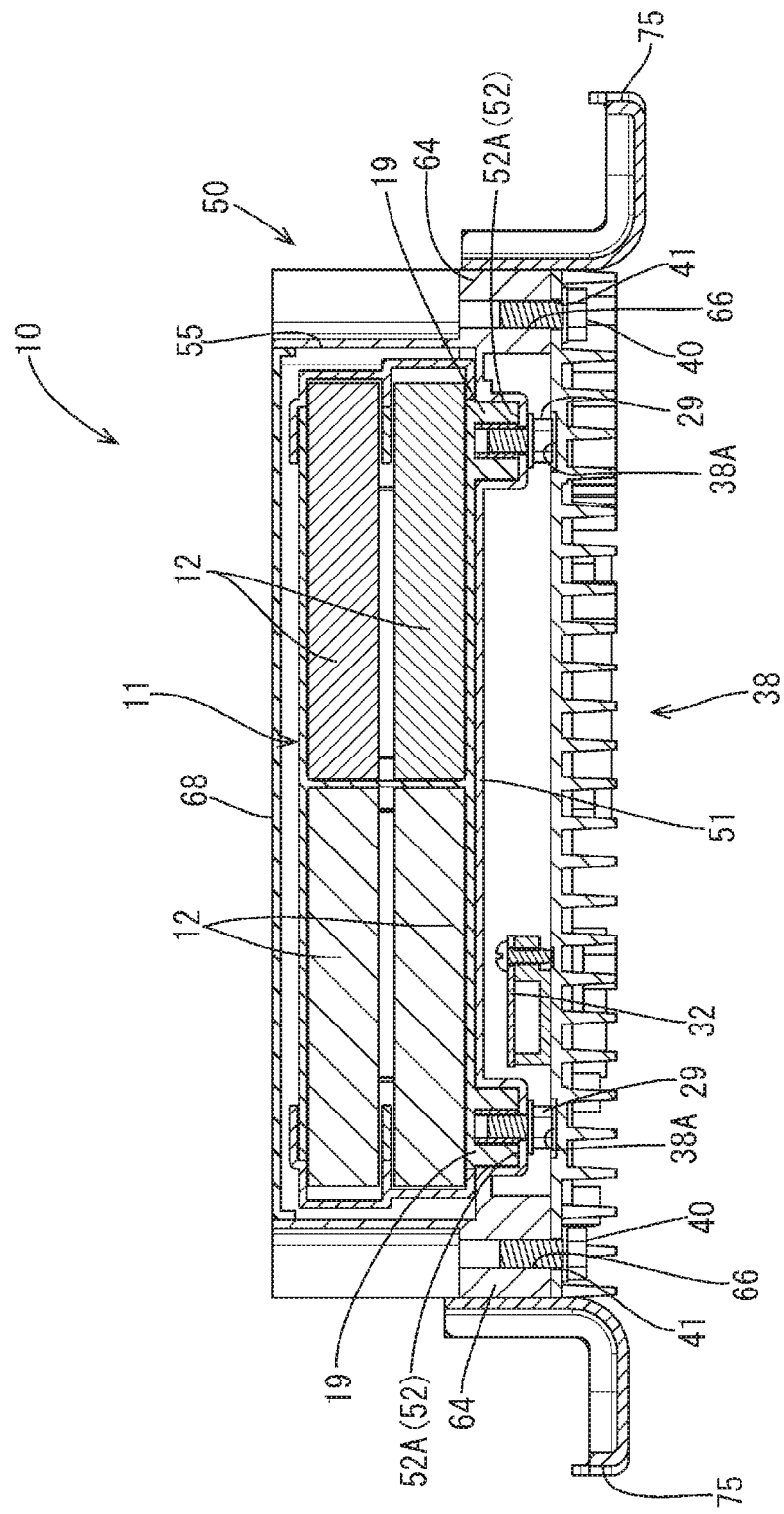
FIG. 3 is a cross-sectional view along a line A-A in FIG. 2.
Figure 4:
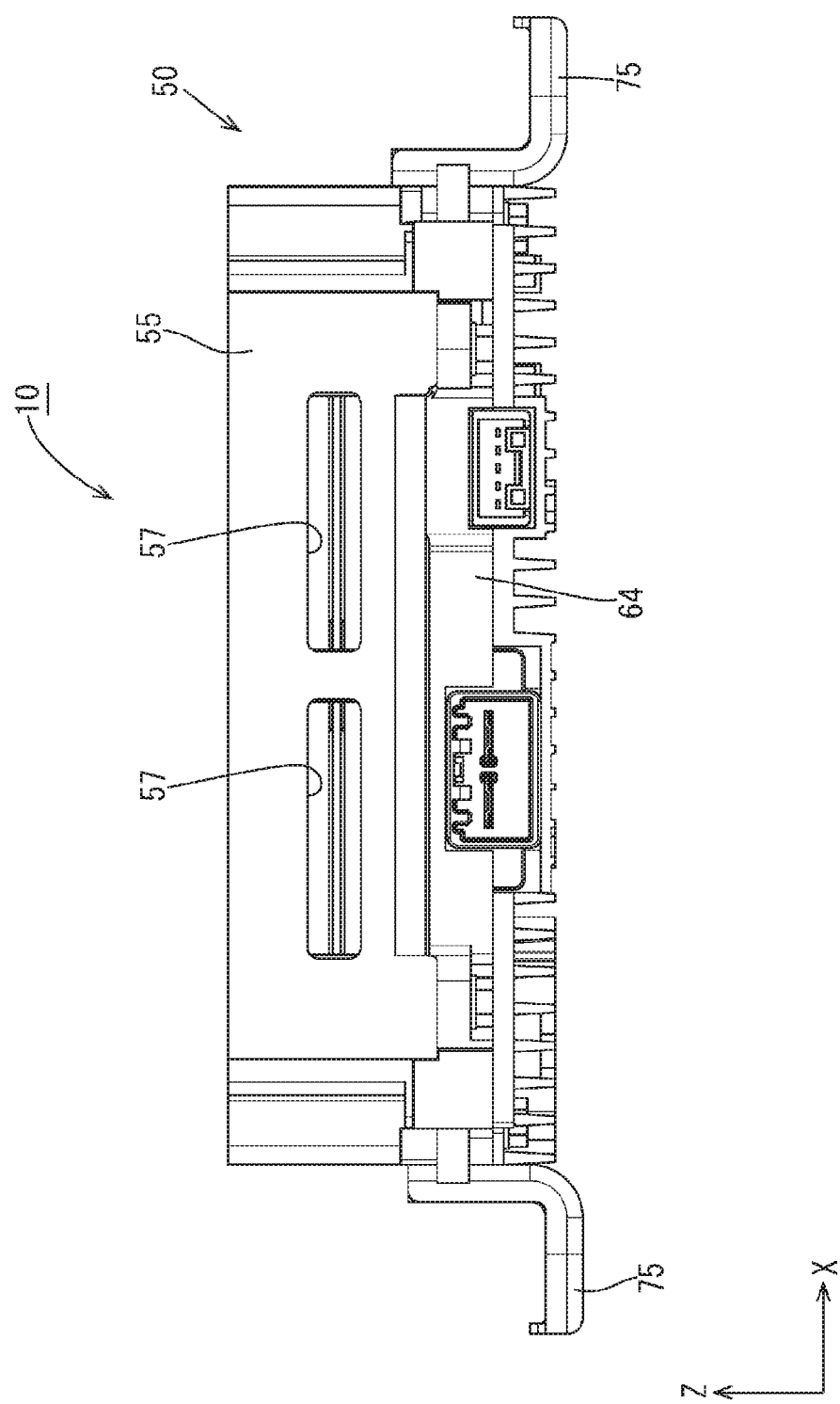
FIG. 4 is a front view showing the electricity storage unit.
Figure 5:
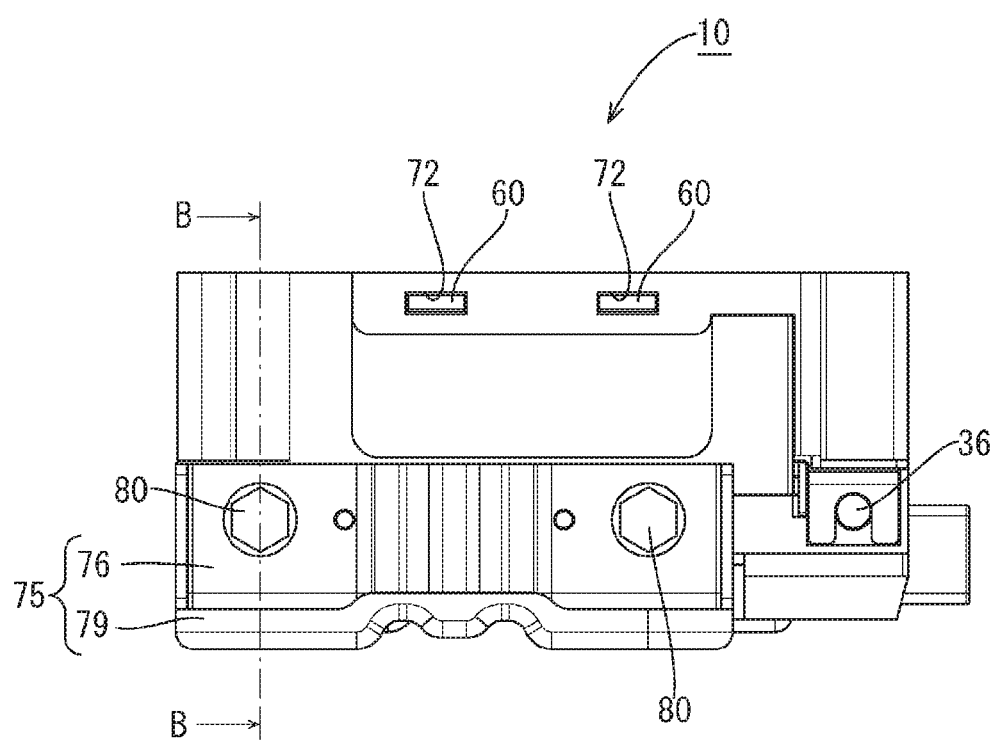
FIG. 5 is a left side view showing the electricity storage unit.
Figure 6:
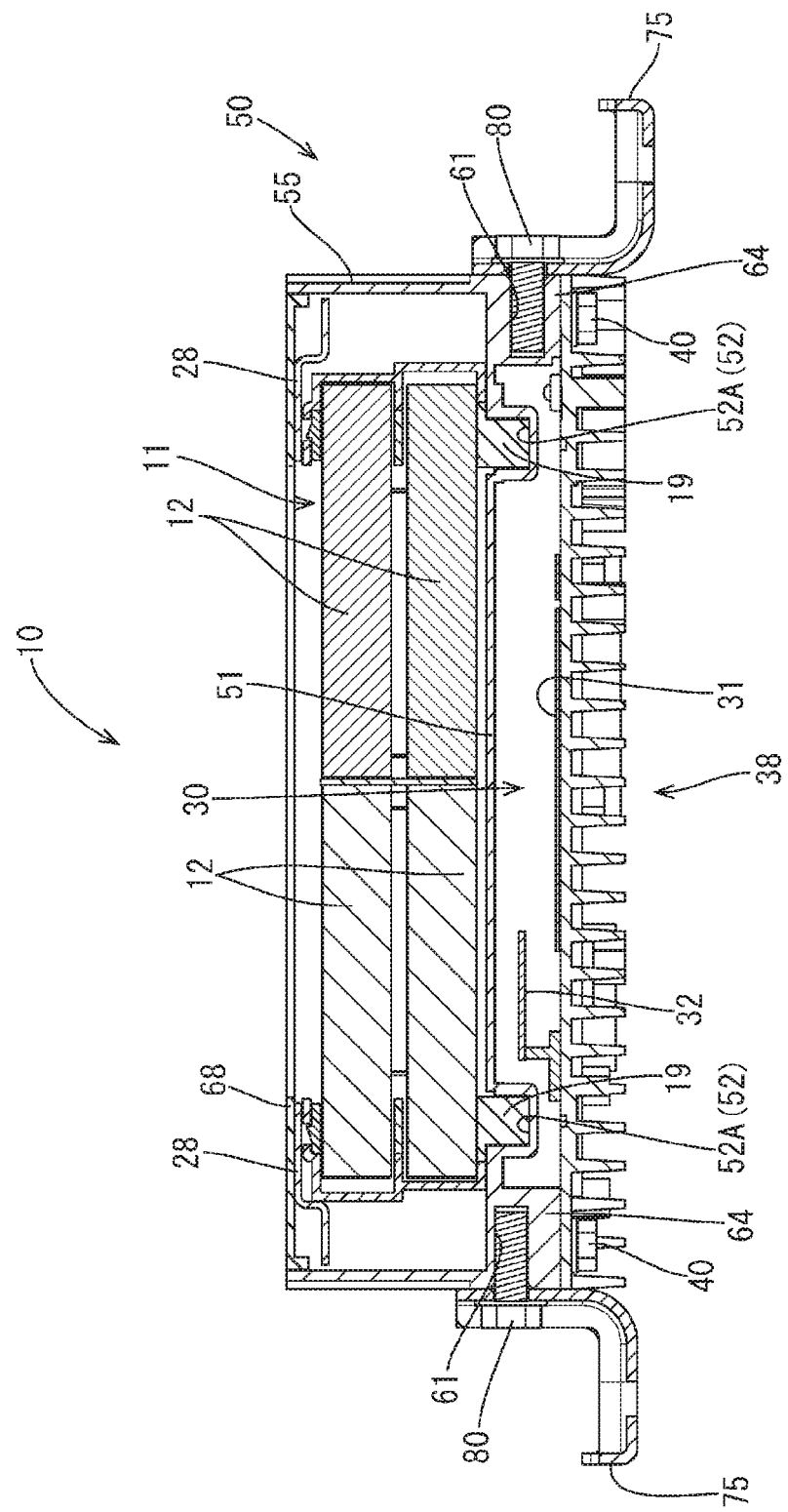
FIG. 6 is a cross-sectional view along a line B-B in FIG. 5.
Figure 7:
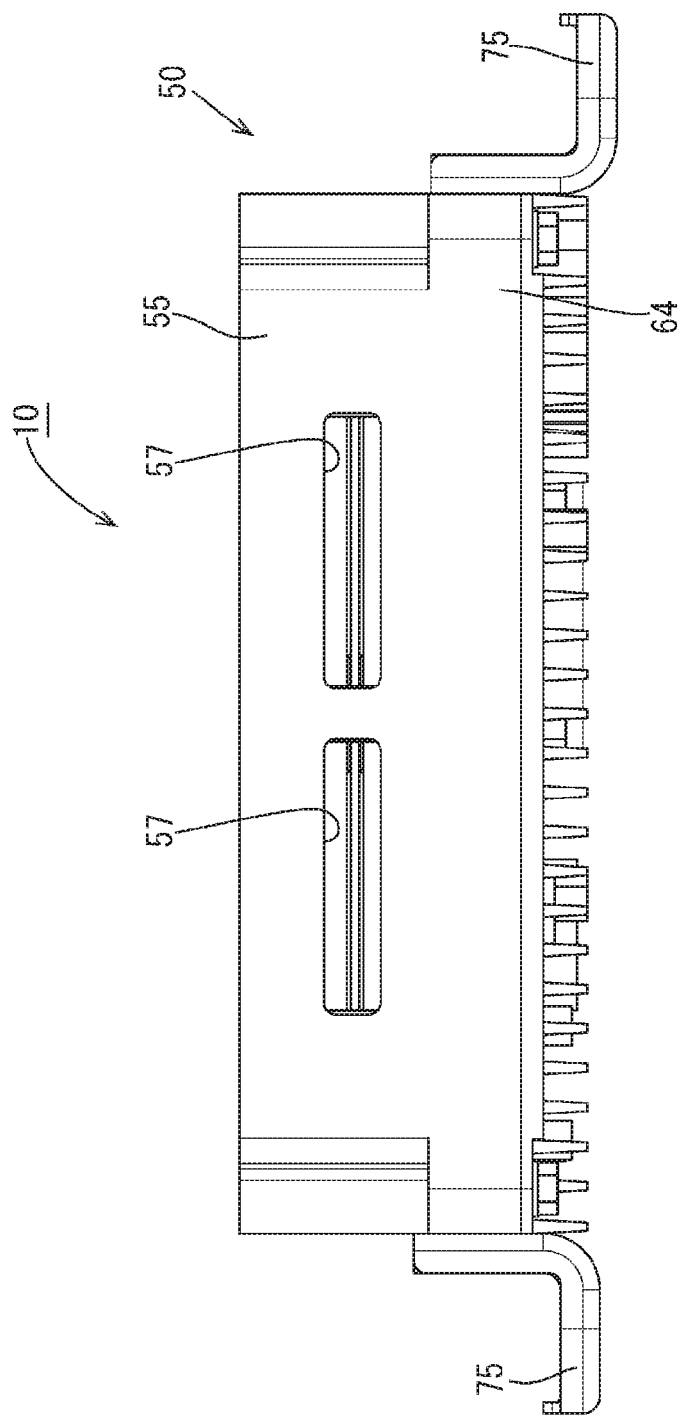
FIG. 7 is a rear view showing the electricity storage unit.
Figure 11:
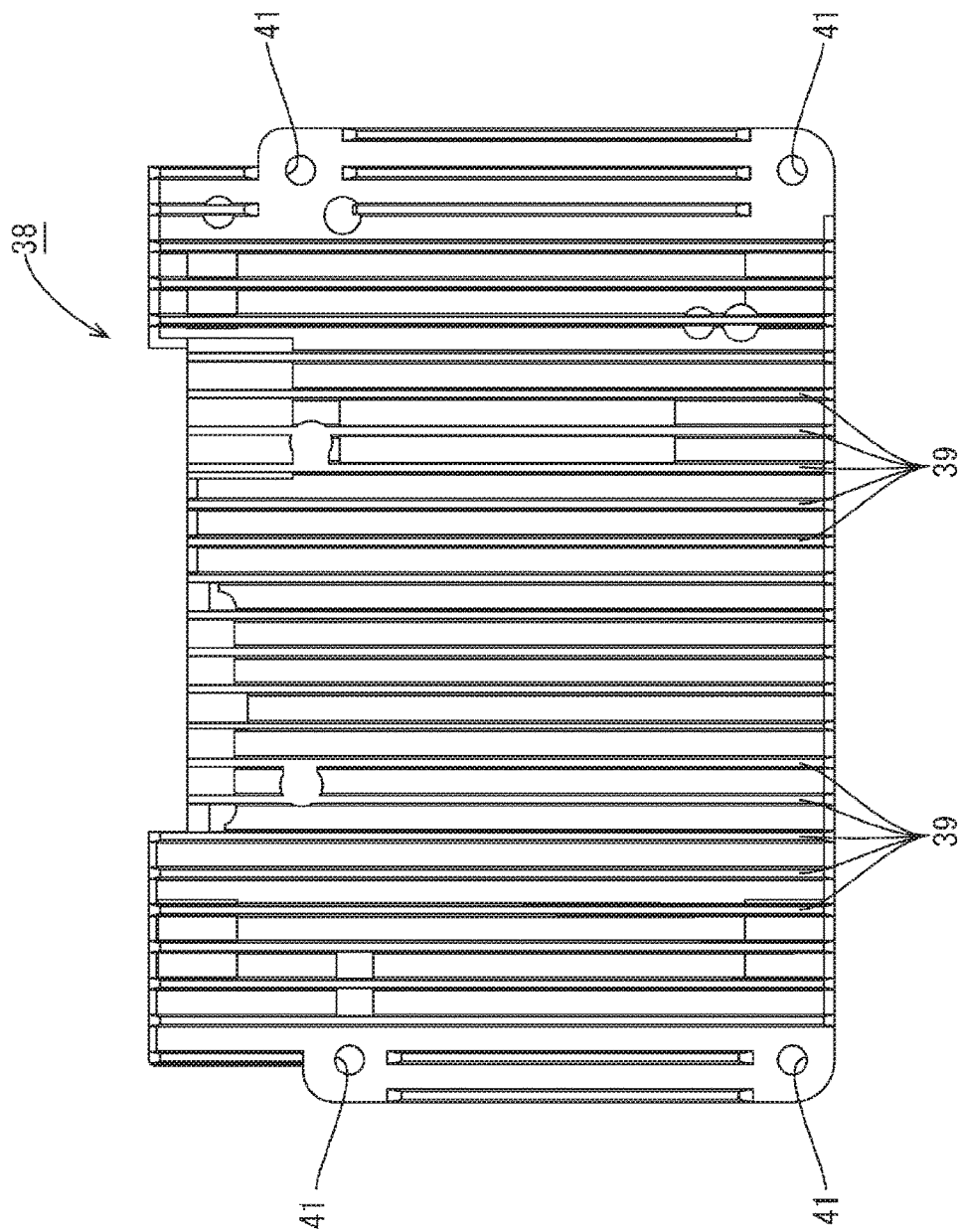
FIG. 11 is a bottom view showing a heat dissipation member.

The heat dissipation member 38 is made of a metal material that has a high thermal conductivity, such as an aluminum alloy or a copper alloy. The heat dissipation member 38 has an upper surface that is flat, and a lower surface on which a large number of heat dissipation fins 39 are arranged. As shown in FIGS. 3 and 11, screw holes 41 that allow fixing to the holding member 50 using metal screws 40 are respectively provided at four positions on a peripheral portion of the heat dissipation member 38.

Holding Member 50

Figure 12:
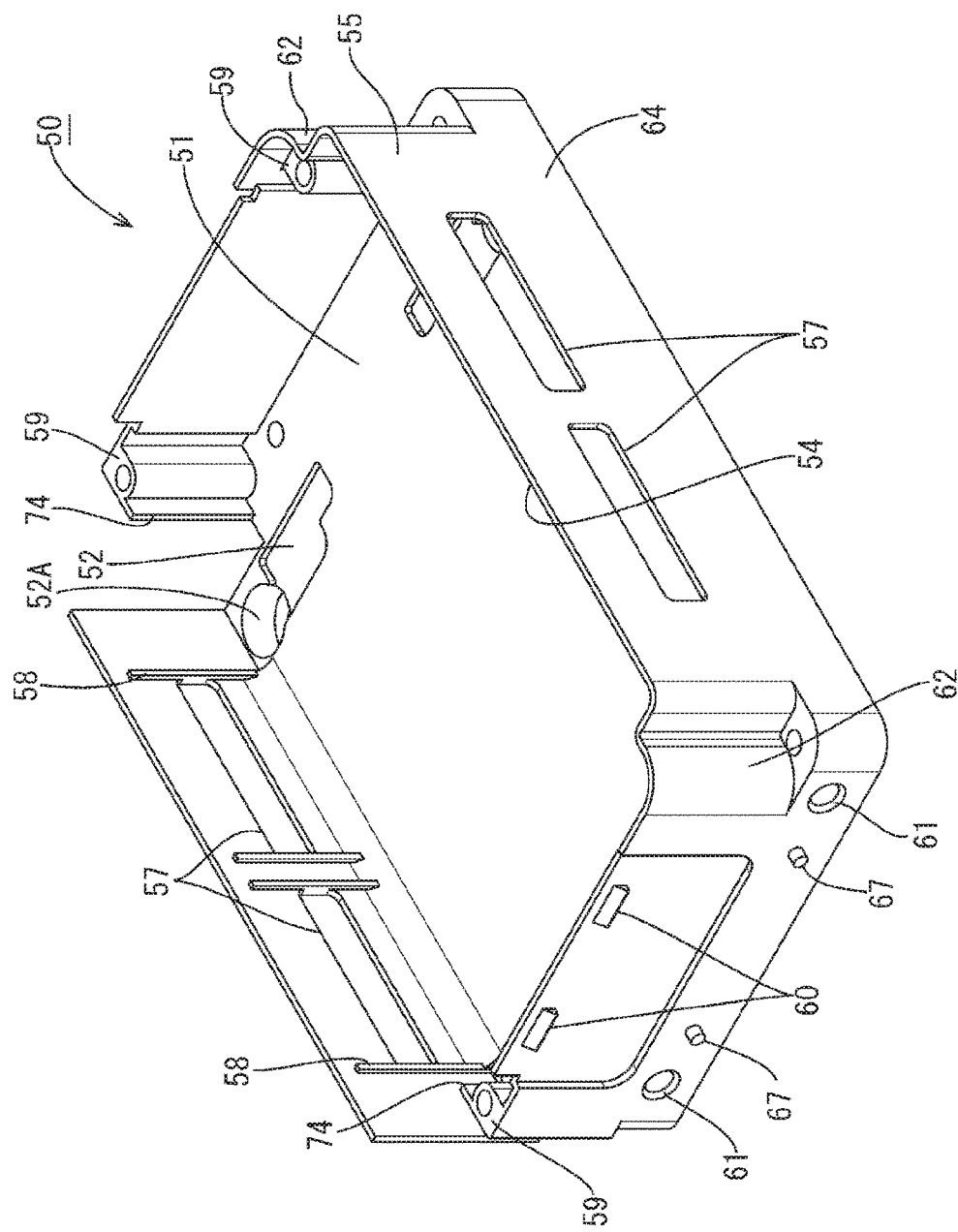
FIG. 12 is a perspective view showing a holding member.
Figure 13:
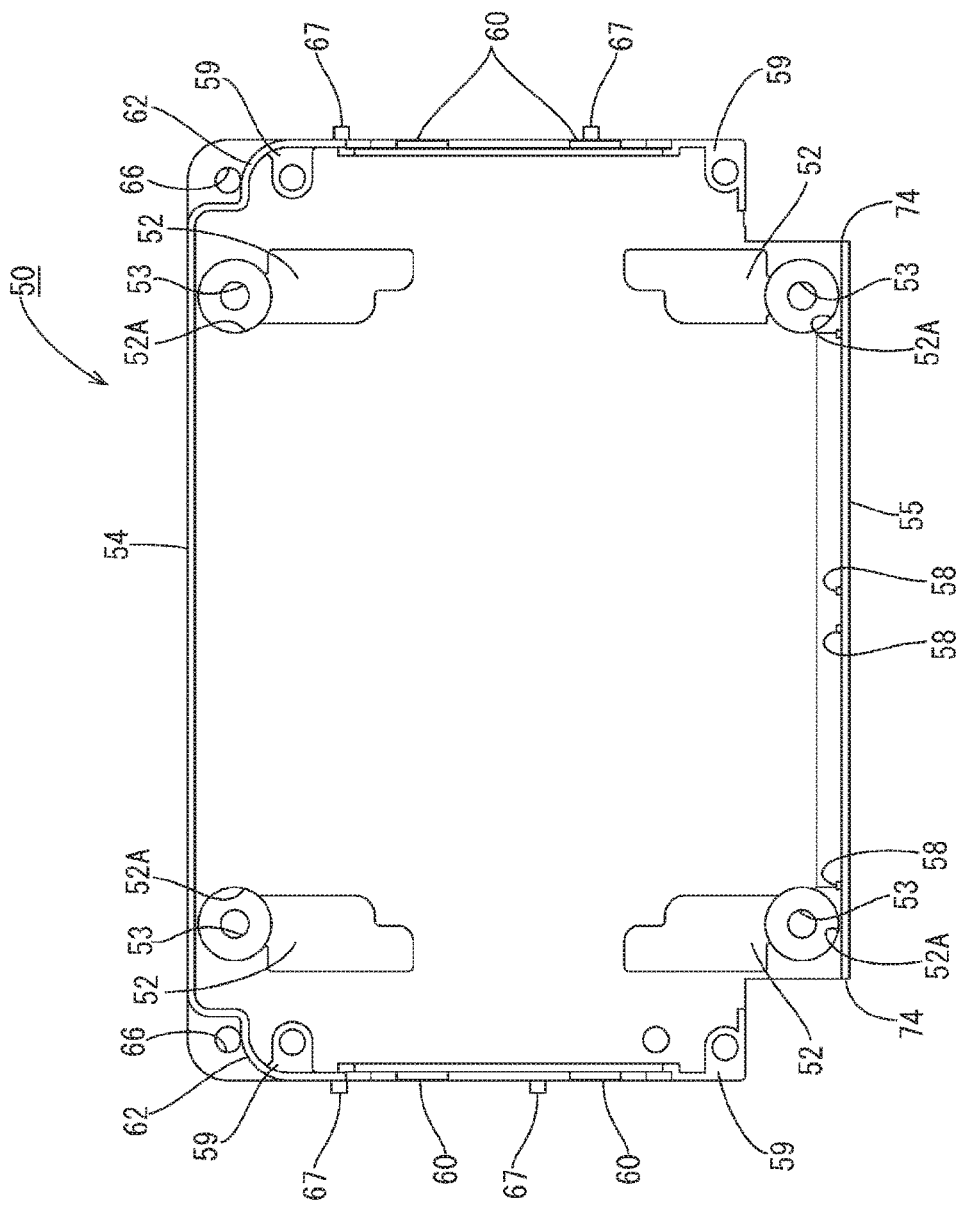
FIG. 13 is a plan view showing the holding member.

The holding member 50 is made of a metal material such as aluminum or an aluminum alloy, and is molded through an aluminum die casting process. As shown in FIGS. 12 and 13, the holding member 50 includes: a partition wall portion 51 that has a rectangular plate shape and is located so as to face the circuit portion 30; a housing wall 55 that has a square tube shape and protrudes upward from a peripheral portion of the partition wall portion 51; and a supporting portion 64 that has a square tube shape and protrudes downward from the peripheral portion of the partition wall portion 51 so as to be lower than the housing wall 55.

The partition wall portion 51 is rectangular and has a size that covers the entire circuit portion 30, and is located so as to face the circuit portion 30 with a gap therebetween. An upper surface of the partition wall portion 51 is provided with positioning portions 52 into which protrusions that are constituted by the bosses 19 and the locking pieces 22 of the electricity storage module 11 are fitted so as to position the electricity storage module 11. The positioning portions 52 are formed as depressions that have a shape that corresponds to the shapes of the bosses 19 and the locking pieces 22. Positioning portions 52A out of the positioning portions 52, into which the bosses 19 are to be fitted, are each provided with a circular pass-through hole 53 that allows the shaft of a screw 29 to pass therethrough, and penetrates the positioning portion 52A. As shown in FIG. 3, in a state where the bosses 19 that are fitted into the positioning portions 52A are fixed using the screws 29, bottom surfaces of the heads of the screws 29 are located inside clearance depressions 38A that are provided in an upper surface of the heat dissipation member 38. Upon a downward force being applied to the electricity storage module 11, the heads of the screws 29 abut against, and are thus supported by, upper surfaces of the clearance depressions 38A.

Figure 14:
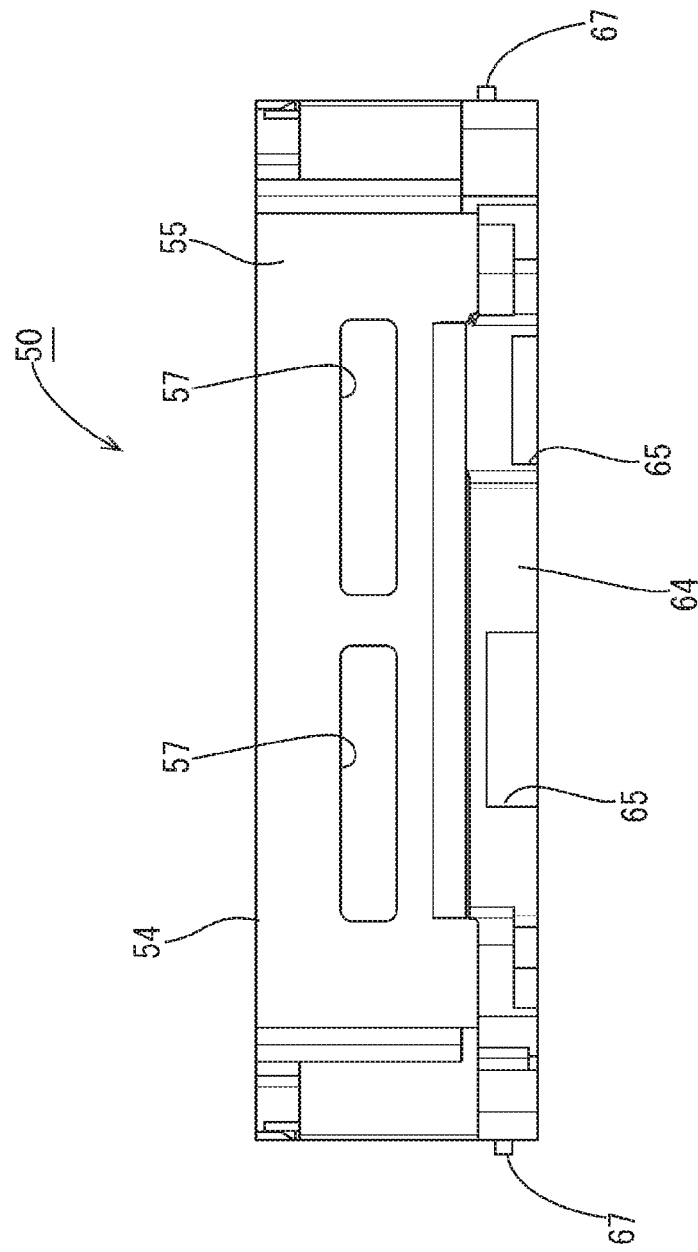
FIG. 14 is a front view showing the holding member.
Figure 15:
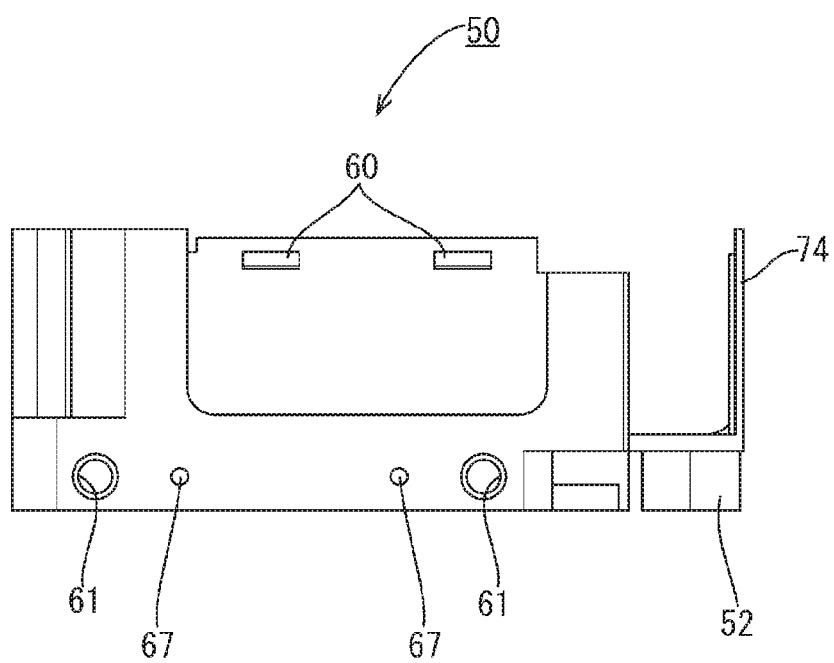
FIG. 15 is a left side view showing the holding member.
Figure 16:
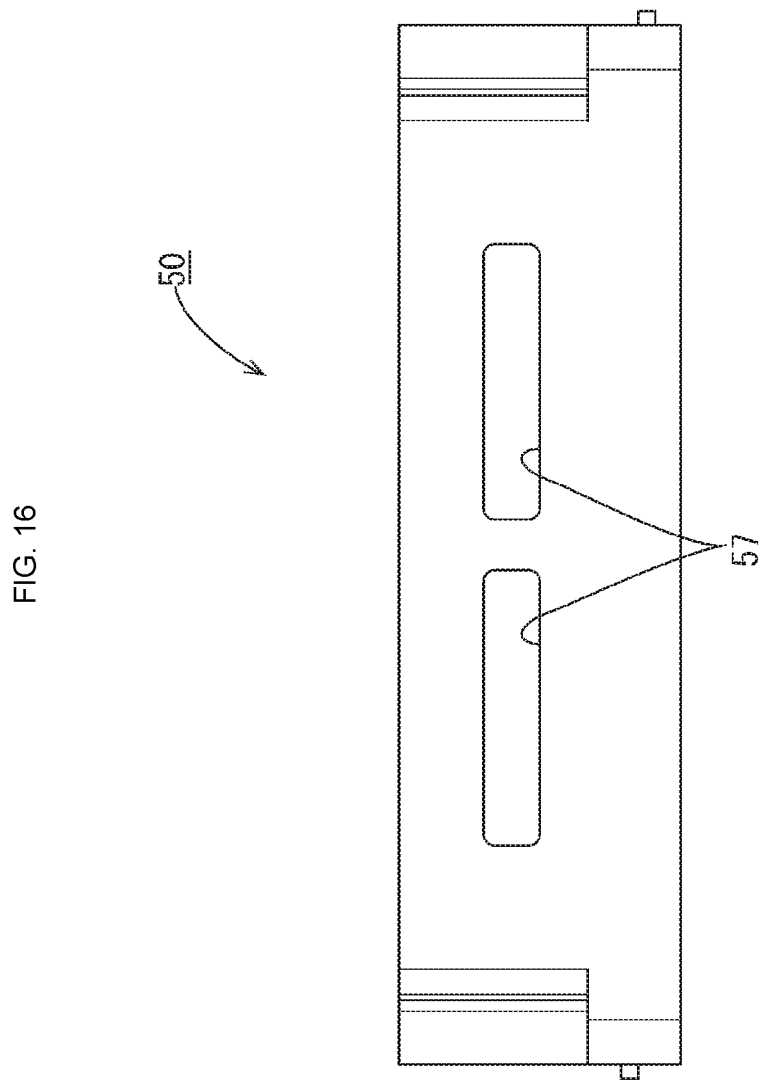
FIG. 16 is a rear view showing the holding member.
Figure 17:
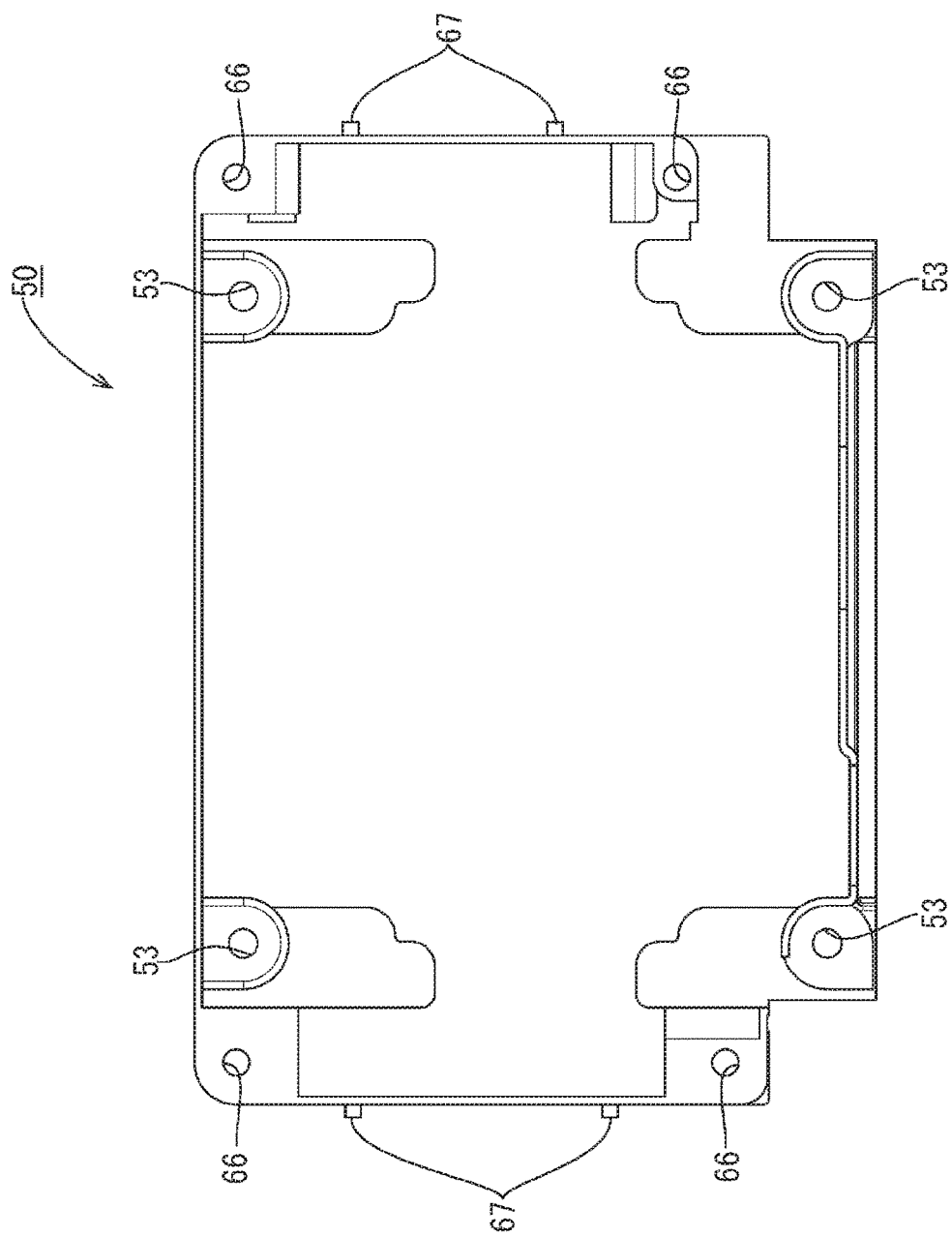
FIG. 17 is a bottom view showing the holding member.

The housing wall 55 has a square tube shape that has a predetermined height that corresponds to the height of the electricity storage module 11, so as to enclose the electricity storage module 11. As shown in FIGS. 12 to 14, a plurality of communicating holes 57 that are rectangular and are interconnected with the exposure holes 18 of the electricity storage module 11 are formed in and penetrate a front wall and a rear wall of the housing wall 55. Ribs 58 that extend in the top-bottom direction are provided so as to protrude from both sides of each communicating hole 57 in the rear wall of the housing wall 55. An upper end portion of the housing wall 55 is provided as the opening portion 54 that has a size that allows the electricity storage module 11 to be inserted into the housing wall 55.

Four stoppers 59 for fixing a pressing plate 28 that is made of metal (see FIG. 8) using screws 23 are formed at inner corner positions of the housing wall 55. The pressing plate 28 is for preventing the electricity storage devices 12 from swelling. The electricity storage module 11 is sandwiched between the partition wall portion 51 and the pressing plate 28, and thus the electricity storage module 11 is positioned in the top-bottom direction. Locking parts 60 for locking the cover 68 are provided so as to protrude from the left and right outer surfaces of the housing wall 55. Terminal lead-out portions 74 are formed at two front-side end portions of the housing wall 55. The terminal lead-out portions 74 divide the housing wall 55 such that the terminal portions 36 can be led out from the terminal lead-out portions 74. Dent portions 62 are formed at two rear-side end portions of the housing wall 55. The dent portions 62 are formed by denting corner portions of the housing wall 55.

The supporting portion 64 is arranged so as to enclose the circuit portion 30 along the entire periphery of the circuit portion 30, and is formed so as to have a height that is sufficient to close a gap from an upper surface of the heat dissipation member 38. The left and right outer surfaces of the supporting portion 64 are provided with: a plurality of screw holes 61 for fixing the attachment portions 75, which are to be attached to an attachment-target portion of a vehicle at a ground potential, using screws 80 that are made of metal; and positioning protrusions 67 for positioning the attachment portions 75. As shown in FIG. 3, a bottom surface of the supporting portion 64 is provided with stoppers 66 that are each constituted by a screw hole for fixing the heat dissipation member 38 using a screw 40. The stoppers 66 are fixed using screws, and thus the heat dissipation member 38 and the supporting portion 64 are electrically connected to each other. The supporting portion 64 abuts against the heat dissipation member 38, and therefore heat that is conducted from the circuit portion 30 and so on to the holding member 50 can be conducted to the heat dissipation member 38. As shown in FIG. 14, a front surface of the supporting portion 64 is provided with cutout portions 65 corresponding to the positions of the connector portions 35. The outer peripheries of the upper halves of the connector portions 35 can be fitted into the cutout portions 65 almost without a gap.

Cover 68

The cover 68 is made of an insulative synthetic resin, and, as shown in FIG. 8, includes: a plate member 69 that has a rectangular plate shape; locking-target portions 71 that are locked to the holding member 50; and fit-in portions 73 that are fitted into the terminal lead-out portions 74. Slits 70 that are arranged in the front-rear direction are provided in and penetrate the plate member 69.

The locking-target portions 71 protrude downward from two side edges of the plate member 69. A plurality of locking holes 72 that each have a rectangular shape are formed in and penetrate each locking-target portion 71. The locking parts 60 of the holding member 50 are locked to the hole edges of the locking holes 72. A corner side of each fit-in portion 73 is depressed so as to be L-shaped. The fit-in portions 73 extend downward.

Each attachment portion 75 is made of a metal that is L-shaped, and includes: a holding member side fixing portion 76 that is fixed to the outer surface of the holding member 50; and an external fixing portion 79 that has a plate-like shape and extends in a direction that is orthogonal to the holding member side fixing portion 76 so as to be fixed to an external member. A pass-through hole 77 that allows the shaft of a screw 80 to pass therethrough and a positioning hole 78 into which a positioning protrusion 67 on the outer surface of a supporting portion 64 is fitted are formed in and penetrate each holding member side fixing portion 76. The holding member side fixing portions 76 are fixed to the outer surface of the supporting portion 64 using the screws 80, and are thus electrically connected to the supporting portion 64. An insertion hole 79A into which a stud bolt or the like of a vehicle is inserted is formed in and penetrates each external fixing portion 79.

Actions and effects of the present embodiment will be described.

According to the present embodiment, the electricity storage unit 10 is provided with the circuit portion 30 and the electricity storage devices 12, and the supporting portion 64 of the holding member 50 that holds the electricity storage devices 12 supports the electricity storage devices 12 (at a position between the electricity storage devices 12 and the heat dissipation member 38). Thus, it is possible to prevent a problem (such as damage to the circuit portion 30) from occurring due to the weight of the electricity storage devices 12. Therefore, it is possible to form an electricity storage unit 10 that can prevent the circuit portion 30 from being damaged, without increasing the size of the electricity storage unit 10 despite the circuit portion 30 and the electricity storage devices 12 being mounted together.

Also, the holding member 50 is made of metal, and the supporting portion 64 is a peripheral wall 64 that extends around the circuit portion 30.

With this configuration, it is possible to support the electricity storage devices 12 in a stable position due to the presence of the peripheral wall 64.

Furthermore, the holding member 50 is provided with the housing wall 55 that houses the electricity storage devices 12, and the thickness of the peripheral wall 64 is greater than the thickness of the housing wall 55.

With this configuration, the supporting portion 64 that has such a thickness can support a force that corresponds to the weight of the electricity storage devices 12. Also, heat can be stored in the supporting portion 64 (the peripheral wall), and can be effectively conducted to the heat dissipation member 38.

Also, the holding member 50 is provided with the partition wall portion 51 between the electricity storage devices 12 and the circuit portion 30. The partition wall portion 51 is provided with the positioning portions 52A that position the electricity storage devices 12.

With this configuration, it is possible to position the electricity storage devices 12 utilizing the configuration of the partition wall portion 51 between the electricity storage devices 12 and the circuit portion 30.

Furthermore, the supporting portion 64 is provided with the stoppers 66 that are fixed to the heat dissipation member 38 using the screws 40 from the bottom side (the side that is opposite to the supporting portion 64).

With this configuration, it is possible to fix the holding member 50 and the heat dissipation member 38 to each other using screws, utilizing the configuration of the supporting portion 64. Also, compared to the case where the supporting portion 64 is fixed from the upper side of the electricity storage devices 12, for example, the electricity storage devices 12 are fixed to a certain degree under the weight of the electricity storage devices 12 being received by the supporting portion 64. Therefore, workability is improved, the structure for fixing is simplified, and thus miniaturization can be realized.

Also, the attachment portions 75 that are to be attached to an external member are provided, and the attachment portions 75 are fixed to the supporting portion 64 using the screws 80.

With this configuration, it is possible to fix the attachment portions 75 utilizing the configuration of the supporting portion. Also, it is possible to stably fix the electricity storage unit 10 to a vehicle even if the weight of the electricity storage devices 12 is heavy.

Furthermore, the holding member 50 is provided with the opening portion 54 into which the electricity storage devices 12 can be inserted, and the cover 68 that is made of resin and closes the opening portion 54.

With this configuration, a portion that needs a relatively lower strength is covered by the cover 68 that is made of resin, and thus manufacturing cost can be reduced.

OTHER EMBODIMENTS

The present invention is not limited to the embodiment that has been described above with reference to the drawings, and, for example, the following embodiments are also included in the technical scope of the present invention.

(1) Although the supporting portion 64 that extends around the circuit portion 30 is employed as a supporting portion, this is not essential. For example, a supporting portion that supports the weight of the electricity storage devices 12 may be provided inward of the outer periphery of the circuit portion 30. Also, for example, the supporting portion may abut against the circuit portion 30 to support the weight of the electricity storage devices 12. Also, although the supporting portion 64 is provided along the entire periphery of the circuit portion 30, this is not essential. For example, the supporting portion may be divided at one or more positions in the direction in which the periphery extends.

(2) Although the circuit portion 30 is provided with two circuit boards 31 and 32, the circuit boards 31 and 32 may be integrated into one circuit board.

(3) Although the holding member 50 in the above-described embodiment is entirely made of metal, it is only necessary that at least the supporting portion is made of metal. For example, portions of the holding member other than the supporting portion may be made of a synthetic resin.

(4) Although the cover 68 is made of an insulative synthetic resin, it may be made of metal.

(5) Although the electricity storage devices 12 are batteries, this is not essential, and they may be capacitors.

(6) It is possible that the holding member 50 is not provided with the housing wall 55.

(7) The electricity storage unit 10 when mounted on a vehicle or the like is not necessarily orientated as mentioned in the above-described embodiment, and may be arranged in various orientations. For example, the electricity storage unit 10 may be arranged such that the left-right direction in FIG. 4 coincides with the top-bottom direction (i.e. the X direction is either the upward direction or the downward direction).

(8) The electricity storage module (the electricity storage devices 12) of the holding member 50 is not necessarily held using the above-described configuration. For example, the holding member may be provided with a locking claw, and the locking claw may lock the electricity storage module (the electricity storage devices 12) so that the electricity storage module (the electricity storage devices 12) can be held at a predetermined position of the holding member.

(9) The number of electricity storage devices 12 is not limited to the number mentioned in the above-described embodiment.

The invention claimed is:

1. An electricity storage unit comprising:
an electricity storage device; a circuit portion on which an electronic component is mounted;
a heat dissipation member that dissipates heat from the circuit portion; and
a holding member that holds the electricity storage device in a state where the electricity storage device, the circuit portion, and the heat dissipation member are stacked such that the circuit portion is located between the electricity storage device and the heat dissipation member,
wherein the holding member includes a pair of opposing inner walls, the each of the pair of opposing inner walls having a supporting portion, the supporting portion having a distal end opposite a proximal end, the distal end abuts against the heat dissipation member, and
a partition wall portion being a planar member extending between the pair of opposing inner walls of the holding member and interconnected to the proximal end of each of the supporting portion so as to be elevated above the circuit portion, the supporting portion bounding a peripheral edge of the partition wall, the partition wall portion having a top surface opposite of a bottom surface, wherein the electricity storage device is placed on the top surface of the partition wall portion and the bottom surface of the partition wall portion is spaced apart from and faces the circuit portion forming a gap therebetween so as to be clear of the circuit portion.

2. The electricity storage unit according to claim 1, wherein the holding member is made of metal, and the supporting portion is a peripheral wall that extends around the circuit portion.

3. The electricity storage unit according to claim 2, wherein the holding member is provided with a housing wall that houses the electricity storage device, and a thickness of the peripheral wall is greater than a thickness of the housing wall.

4. The electricity storage unit according to claim 3, wherein the holding member is provided with a partition wall portion between the electricity storage device and the circuit portion, and the partition wall portion is provided with a positioning portion that positions the electricity storage device.

5. The electricity storage unit according to claim 3, wherein the supporting portion is provided with a stopper that is fixed to the heat dissipation member from the opposite side to the supporting portion using a screw.

6. The electricity storage unit according to claim 3, wherein the supporting portion is provided with a stopper that is fixed to the heat dissipation member from the opposite side to the supporting portion using a screw.

7. The electricity storage unit according to claim 2, wherein the holding member is provided with a partition wall portion between the electricity storage device and the circuit portion, and the partition wall portion is provided with a positioning portion that positions the electricity storage device.

8. The electricity storage unit according to claim 2, wherein the supporting portion is provided with a stopper that is fixed to the heat dissipation member from the opposite side to the supporting portion using a screw.

9. The electricity storage unit according to claim 2, wherein the supporting portion is provided with a stopper that is fixed to the heat dissipation member from the opposite side to the supporting portion using a screw.

10. The electricity storage unit according to claim 1, wherein the partition wall portion is provided with a positioning portion that positions the electricity storage device.

11. The electricity storage unit according to claim 10, wherein the supporting portion is provided with a stopper that is fixed to the heat dissipation member from the opposite side to the supporting portion using a screw.

12. The electricity storage unit according to claim 10, wherein the supporting portion is provided with a stopper that is fixed to the heat dissipation member from the opposite side to the supporting portion using a screw.

13. The electricity storage unit according to claim 1, wherein the supporting portion is provided with a stopper that is fixed to the heat dissipation member from the opposite side to the supporting portion using a screw.

14. The electricity storage unit according to claim 13, wherein the supporting portion is provided with a stopper that is fixed to the heat dissipation member from the opposite side to the supporting portion using a screw.

15. The electricity storage unit according to claim 1, further comprising: an attachment portion that is to be attached to an external member, wherein the attachment portion is fixed to the supporting portion using a screw.

* * * * *